United States Patent
Yang et al.

(10) Patent No.: US 6,225,222 B1
(45) Date of Patent: May 1, 2001

(54) DIFFUSION BARRIER ENHANCEMENT FOR SUB-MICRON ALUMINUM-SILICON CONTACTS

(75) Inventors: Chi-Cheng Yang; Kuo-Yun Kuo; Jenn-Tarng Lin, all of Hsin-Chu (TW)

(73) Assignee: United Microelectronics Corporation, Hsin-chu (TW)

( * ) Notice: Subject to any disclaimer, the term of this patent is extended or adjusted under 35 U.S.C. 154(b) by 0 days.

(21) Appl. No.: 09/219,490

(22) Filed: Dec. 23, 1998

Related U.S. Application Data

(60) Provisional application No. 60/009,357, filed on Dec. 29, 1995.

(51) Int. Cl.[7] .................................................. H01L 21/44
(52) U.S. Cl. ........................................... 438/682; 438/396
(58) Field of Search .................................... 438/682, 740, 438/733, 738, 245, 396, 638, 660, 685; 437/189, 60, 192, 919; 257/751, 653, 757, 330

(56) References Cited

U.S. PATENT DOCUMENTS

| | | | |
|---|---|---|---|
| 5,391,519 | * | 2/1995 | Lur et al. .............................. 438/612 |
| 5,420,072 | * | 5/1995 | Fiordalice et al. ................... 438/607 |
| 5,466,629 | * | 11/1995 | Mihara et al. ........................ 437/60 |
| 5,514,622 | * | 5/1996 | Bornstein et al. ................... 437/189 |
| 5,534,463 | * | 7/1996 | Lee et al. ............................. 438/643 |
| 5,654,235 | * | 8/1997 | Matsumoto et al. ................. 438/643 |
| 5,744,386 | * | 4/1998 | Kenney ................................ 438/245 |
| 5,776,831 | * | 7/1998 | Padmanabhan et al. ............ 438/653 |
| 5,907,188 | * | 5/1999 | Nakajima et al. ................... 257/751 |

* cited by examiner

*Primary Examiner*—David Nelms
*Assistant Examiner*—Phuc T. Dang
(74) *Attorney, Agent, or Firm*—Rabin & Champagne, P.C.

(57) ABSTRACT

Methods for enhancing the effectiveness of barrier layers, needed to prevent interaction between overlying aluminum interconnect metallizations, and underlying silicon device regions, has been developed. One method consists of using dual layers of titanium nitride, on titanium disilicide. The first titanium nitride layer is obtained via rapid thermal annealing of an underlying titanium layer, in a nitrogen containing ambient, also resulting in the formation of the underlying titanium disilicide layer. The second titanium nitride layer is deposited using reactive sputtering. A second method, used to create an enhanced barrier layer, is to reactively sputter titanium nitride, directly on an underlying titanium layer. Rapid thermal annealing, in an ammonia and oxygen ambient, results in an oxygen containing titanium nitride barrier layer. The rapid thermal anneal cycle also converts the underlying titanium layer, to the desired titanium disilicide layer. The barriers produced by these methods have demonstrated barrier effectiveness, in terms of preventing aluminum penetration, when compared to counterparts, fabricated without the use of the processes, described in this invention.

9 Claims, 5 Drawing Sheets

DIFFUSION BARRIER ENHANCEMENT FOR SUB-MICRON ALUMINUM-SILICON CONTACTS

This application claims priority from provisional application Ser. No. 60/009,357, filed Dec. 29, 1995.

BACKGROUND OF THE INVENTION

1. Field of the Invention

This invention relates to fabrication methods used for semiconductor devices and more specifically to an improved process to create barrier films of the type used to separate aluminum-based metallizations from silicon regions contacted thereby.

2. Description of the Related Art

The semiconductor industry continually strives to increase device performance while maintaining or decreasing the cost of manufacturing advanced silicon chips. These objectives have been realized, in part, by the ability of the semiconductor industry to achieve silicon device miniaturization. The ability to produce silicon devices with sub-micron critical features has resulted in significant device performance improvements, for example by reducing the resistance of metal interconnect wiring, as well as reducing capacitance with underlying silicon device regions. Miniaturization has also contributed to cost reductions. The ability to reduce critical device dimensions has led to a significant reduction in chip size, allowing more chips to be produced from a specific silicon wafer size, thereby reducing the cost per chip.

The attainment of miniaturization relates to advances in semiconductor fabrication. Advances in photolithography including advanced exposure cameras as well as more sensitive photoresist materials have enabled sub-micron images in photoresist to be routinely achieved. Similar advances in selective dry etching and particularly anisotropic reactive ion etching (RIE) have allowed sub-micron images in photoresist to be successfully transferred to the underlying device layers during the fabrication of semiconductor chips. Other fabrication disciplines such as ion implantation and low pressure chemical vapor deposition (LPCVD) have also been major contributing factors in the miniaturization of the device.

However, problems arise with continued miniaturization. As the metal filled contact holes used to connect overlying interconnect wiring lines to underlying silicon regions become smaller, undesirable phenomena that are not observed in larger contact hole structures can occur. For example, it can be difficult to form an effective barrier layer at the bottom of a contact hole which has a large aspect ratio, such as may arise for deep holes having openings of about 0.5 μm across or smaller. An effective barrier layer is most preferably formed between a doped silicon region and the metal line that contacts the doped silicon region. Effective barrier layers are particularly important when the metal line which contacts the doped silicon region includes a comparatively high aluminum concentration. For such connections, an effective barrier layer limits the extent of aluminum penetration into underlying silicon device regions. Such penetration, known as "spiking," can result in junction degradation, particularly when the aluminum "spike" penetrates through a source/drain region, allowing signals on the source/drain region to couple more directly to the substrate.

The barrier layer, in most cases a titanium nitride (TiN) layer, is usually formed on a titanium disilicide underlying layer, which enhances the ohmic nature of the contact between the metal interconnect line and the doped silicon regions. Conventionally, titanium disilicide is produced by directly depositing of a titanium layer onto an exposed silicon region, followed by one or more heat cycles to convert the titanium to titanium disilicide and to modify the crystalline structure of the materials formed in the initial part of the reaction. In some cases, the titanium silicide is formed in a nitrogen or ammonia ambient, thus producing a titanium disilicide layer at the interface between the deposited titanium layer and the doped silicon region at the bottom of the contact hole. A TiN barrier layer is created in the same processing steps used to form the underlying titanium disilicide. This process, sometimes referred to as rapid thermal nitridation (RTN), forms a limited thickness of TiN. TiN forms as a layer over the deposited titanium so that subsequent reaction of the nitrogen ions with the unreacted titanium requires the diffusion of nitrogen through the TiN layer to the unreacted titanium. The TiN layer acts as a barrier to the diffusion of nitrogen or ammonia so that, after an initial thickness of TiN is formed, additional TiN is formed slowly. As a practical matter, then, only a given thickness of titanium nitride layer can be formed in a manner that is readily compatible with the demands of mass production.

A different method that can be used to create TiN barrier layers uses reactive sputtering. A titanium disilicide ohmic contact layer is formed by deposition of titanium followed by heat treatments which convert titanium to titanium disilicide. The TiN barrier layer is then deposited by sputtering titanium in a nitrogen containing ambient under conditions that allow the titanium to react with the titanium prior to or during deposition to form titanium nitride. This method undesirably requires two separate sputtering chambers, since the reactive sputtering process can cause significant amounts of TiN to deposit on the titanium target. If a titanium target contaminated with titanium nitride is used to deposit what should be pure titanium, titanium nitride may instead deposit and the deposited material may not be suitable for forming a good ohmic contact with the silicon region. In addition, the amount of material that can practically be sputtered into the contact hole by this method is limited by the high aspect ratio of the contact hole.

SUMMARY OF THE PREFERRED EMBODIMENTS

It is therefore an object of the present invention to create suitable TiN barrier layers using a method which provides a sufficient amount of material to these high aspect ratio contact holes so that the TiN layers can be used as effective barriers to aluminum spiking or other undesirable diffusion phenomena. Preferred embodiments of the present invention include methods for providing TiN adequate barrier layers of the type desirable for successful advanced semiconductor devices.

One aspect of this invention fabricates silicon devices in which a barrier layer of titanium nitride is used to reduce or prevent interdiffusion from occurring between an aluminum metallization interconnect and silicon, such as that which conventionally occurs at the interface between an aluminum contact and an underlying silicon device region.

Another object of this invention provides a titanium nitride barrier on an underlying titanium disilicide layer.

Yet another aspect of this invention creates an underlying titanium disilicide and an overlying titanium nitride layer from a titanium layer by performing a rapid thermal annealing process on the titanium layer in an nitrogen containing ambient.

A further aspect of this invention deposits additional titanium nitride, by reactive sputtering on an underlying titanium nitride layer previously formed by rapid thermal annealing.

Still another aspect of this invention deposits titanium nitride via reactive sputtering on an underlying titanium layer and then uses a rapid thermal annealing process to create a titanium disilicide contact layer.

In accordance with the present invention, methods are described for forming enhanced barrier layers in small contact holes to eliminate or reduce aluminum-silicon interdiffusion at an interface between aluminum and silicon. One method for creating the enhanced barrier in a small contact hole consists of initially depositing a titanium layer, followed by rapid thermal annealing in a nitrogen, ammonia, or other nitrogen-bearing ambient. The annealing process creates a lower layer of titanium disilicide and an upper layer of titanium nitride. The effectiveness of the titanium nitride barrier layer formed in this fashion is next enhanced by an additional deposition of titanium nitride, via reactive sputtering, on the already existing underlying titanium nitride layer. A second method for creating enhanced barriers consists of initially depositing a titanium layer, followed by reactive sputtering deposition of a titanium nitride layer. Rapid thermal annealing is then performed, preferably in an ammonia and oxygen ambient, to form an underlying titanium disilicide layer and an oxygen-containing overlying titanium nitride barrier layer.

BRIEF DESCRIPTION OF THE DRAWINGS

The objects and other advantages of this invention are best understood in the following description of the preferred embodiments with reference to the attached drawings.

DESCRIPTION OF THE PREFERRED EMBODIMENTS

Preferred embodiments of the invention form enhanced barriers layers of the type that might be used to eliminate or prevent aluminum penetration into silicon device regions. The following discussion emphasizes the application of such a barrier layer as part of a metal oxide semiconductor field effect transistor (MOSFET) device, of the sort presently manufactured. As such, the following discussion does not describe in detail all of the conventional aspects of MOSFET formation. Rather, the following discussion emphasizes the aspects of embodiments of the present invention which best aid the understanding of this invention.

Figure 1:
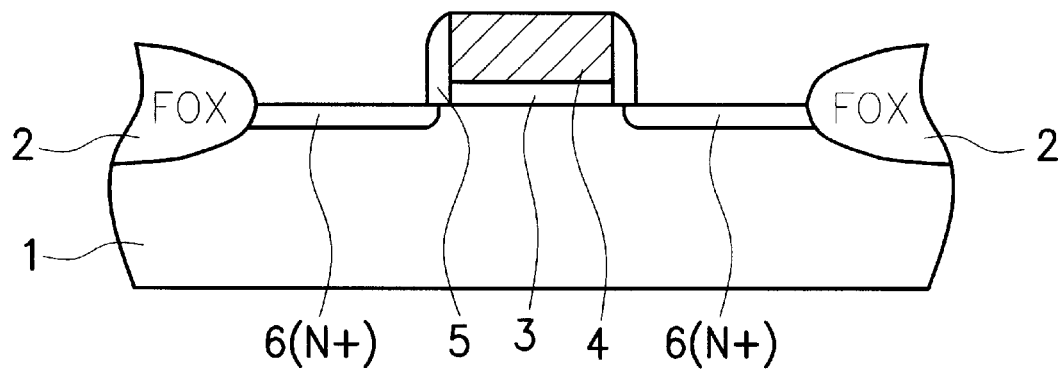
FIGS. 1–2 schematically show, in a cross-sectional representation, a silicon device structure incorporating an enhanced barrier layer.

FIG. 1 shows an N-type, field effect transistor (NFET) incorporating an enhanced barrier layer in accordance with the present invention. A substrate 1 composed of P-type single crystalline silicon with a <100> crystallographic orientation is preferred and thick field oxide (FOX) regions 2 are formed on the surface of the substrate as device isolation structures. The field isolation structures surround the regions where devices are to be created and serve to define the active regions of the device. The FOX isolation regions 2 may be formed by the local oxidation of silicon (LOCOS) technique, forming a silicon oxide/silicon nitride mask, exposing the exposed portions of the silicon substrate 1 to an oxygen-steam ambient at a temperature between about 800 to 1000° C. to grow a silicon dioxide region having a thickness of between about 4000 to 6000 Å. At the completion of the FOX oxidation, the masking silicon nitride/silicon dioxide mask is removed in hot phosphoric acid, followed by a buffered hydrofluoric acid procedure. After careful wet chemical cleansing, a thin (about 100 to 300 Å thick), thermal silicon dioxide gate insulator layer 3 is grown at a temperature of between about 850 to 950° C. in an oxygen-steam ambient. Next, a layer of polysilicon 4 is deposited using low pressure chemical vapor deposition process (LPCVD) to a thickness of between about 2000 to 4000 Å. The polysilicon layer 4 is doped via ion implantation of phosphorous ions at an energy between about 50 to 100 KeV to a dose between about $1 \times 10^{13}$ to $5 \times 10^{14}$ atoms/$cm^2$. Standard photolithographic and reactive ion etching (RIE) procedures using a chlorine etch chemistry are employed to create a polysilicon gate structure 4 as shown in FIG. 1. After photoresist removal via oxygen plasma ashing and careful wet cleansing, an LPCVD procedure is used to deposit a silicon oxide layer to a thickness or between about 1000 to 4000 Å, using tetraethylorthosilicate (TEOS) as a source gas and a deposition temperature of between about 500 to 700° C. Reactive ion etching (RIE) using $CHF_3$, or another anisotropic and selective etching process, is used to create silicon oxide sidewall spacer 5. An N+ source or drain region 6 is next created via an ion implantation of arsenic ions at an energy between about 50 to 100 KeV and to a dose between about $1 \times 10^{14}$ to $1 \times 10^{15}$ atoms/$cm^2$.

Figure 2:
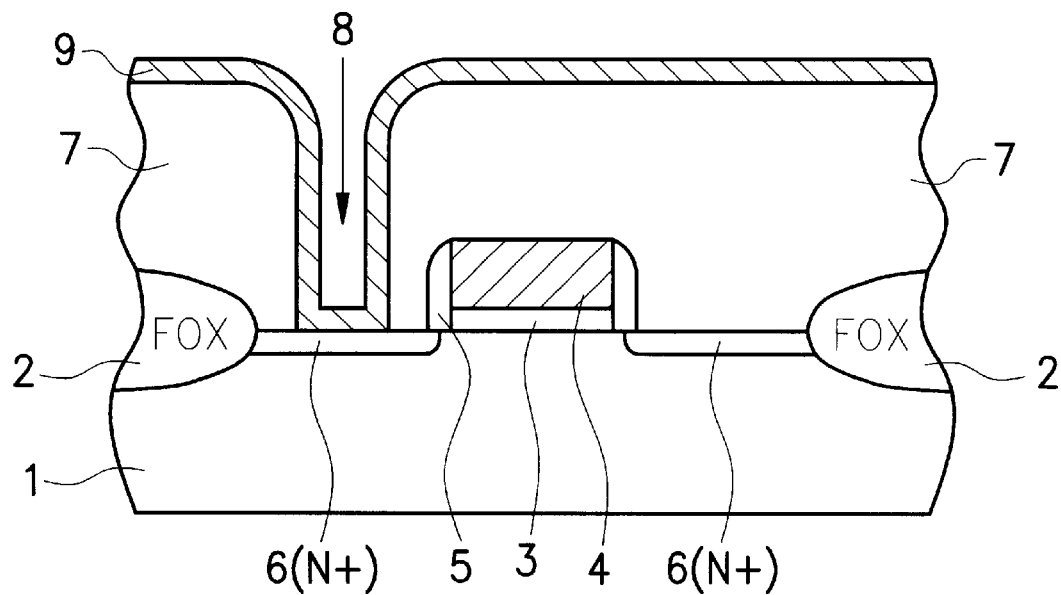

Another silicon oxide layer 7, shown in FIG. 2, is deposited using LPCVD, plasma enhanced chemical vapor deposition (PECVD), or atmospheric pressure chemical vapor deposition (APCVD), at a temperature of between about 400 to 800° C. to a thickness of between about 5000 to 10000 Å. Conventional photolithographic and RIE processes using $CHF_3$ as an etchant are used to open contact hole 8 through silicon oxide layer 7, exposing the N+ source and drain region 6. After photoresist removal, via oxygen plasma ashing or equivalent process followed by careful wet chemical cleansing, a layer of titanium 9 is deposited, preferably using d.c. sputtering, to a preferred thickness of between about 300 to 800 Å.

Figure 3:
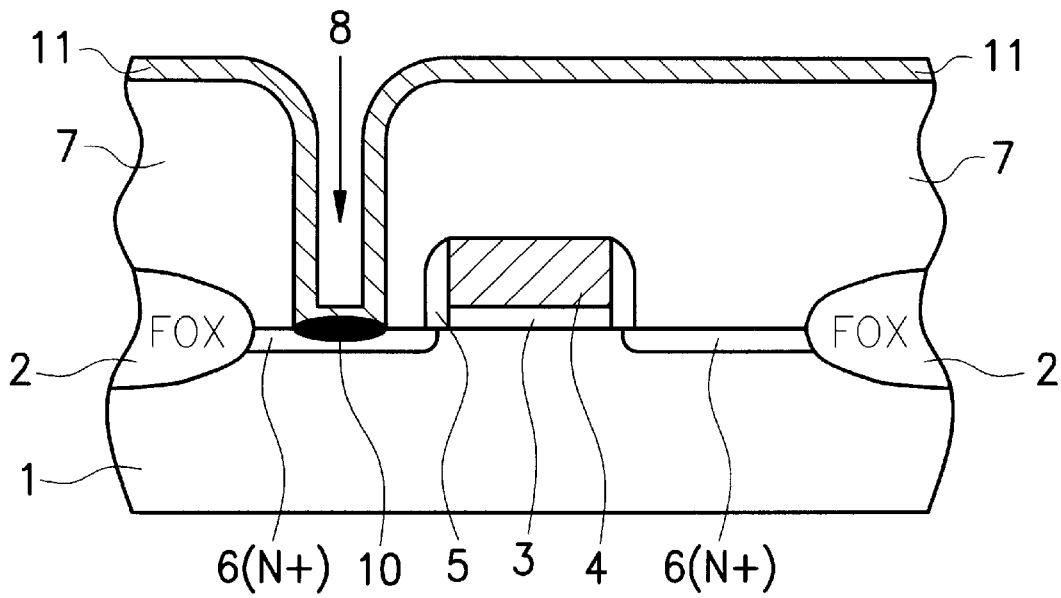
FIGS. 3–4 schematically indicate, in a cross-sectional representation, a process used to create an enhanced barrier layer.
Figure 4:
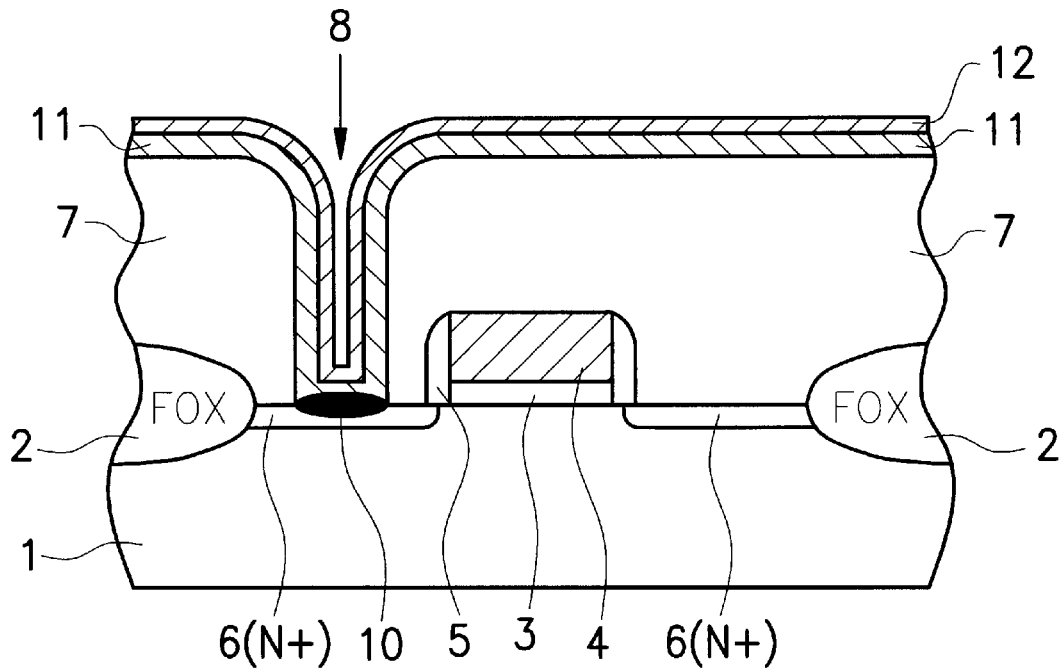

A first embodiment of a contact structure in accordance with this invention will now be shown in FIGS. 3–4. The structure shown schematically in FIG. 2 is subjected to a rapid thermal nitridization (RTN) procedure, preferably at a temperature of between about 600 to 800° C. for a preferred time between about 60 to 100 seconds, in a nitrogen, ammonia or other nitrogen-containing ambient. This procedure results in the formation of a titanium disilicide layer 10 at the bottom of contact hole 8 having a thickness of between about 200 to 500 Å. The titanium disilicide layer forms an ohmic contact with the doped silicon region and thus provides a good ohmic contact between the underlying N+ region 6 and the overlying layers formed over the titanium disilicide layer in this embodiment. The RTN process, in addition to converting the bottom portion of titanium layer 9 to titanium disilicide layer 10, also converts a top or surface portion of titanium layer 9 to a titanium nitride layer 11, preferably having a thickness between about 150 to 200 Å. This is shown schematically in FIG. 3. The titanium nitride layer serves as a barrier layer which prevents or at least limits aluminum penetration from a subsequently deposited aluminum interconnect metallization into the underlying silicon device regions. Aluminum has a significant level of solubility in silicon so that there is a significant likelihood of aluminum and silicon interdiffusion (including "spiking") occurring during any subsequent thermal processing step. It is particularly preferred that a sufficient thickness of titanium nitride be provided to function as a barrier layer between the titanium silicide layer and any aluminum-based metallization to be formed. The RTN process is typically limited in the amount of titanium nitride that can easily be formed due to the slow diffusion of nitrogen through the titanium nitride layer being grown. Thus, the thin layer of titanium nitride initially formed may be undesirably thin to act as a reliable barrier. Most preferably, therefore, a second titanium nitride layer 12, shown in FIG. 4, is deposited on the first titanium nitride layer 11. The second titanium nitride layer 12 is preferably deposited via d.c. sputtering, preferably at a power of between about 5000 to 10000 watts, most preferably using an ammonia or nitrogen flow at a rate between about 20 to 30 sccm, resulting in a preferred layer thickness between about 300 to 800 Å. This dual layer titanium nitride barrier preferably has a total barrier thickness of between about 200 to 1000 Å. The reactive sputter deposition of titanium nitride layer 12 is preferably performed in a chamber different from the chamber used to deposit the pure titanium used to form titanium disilicide layer 10 as well as titanium nitride layer 11. If the same sputtering chamber is used to deposit both the titanium layer 9 and the titanium nitride layer 12, a significant amount of titanium nitride might form on the titanium target, resulting in difficulties in subsequently depositing pure titanium.

Figure 5:
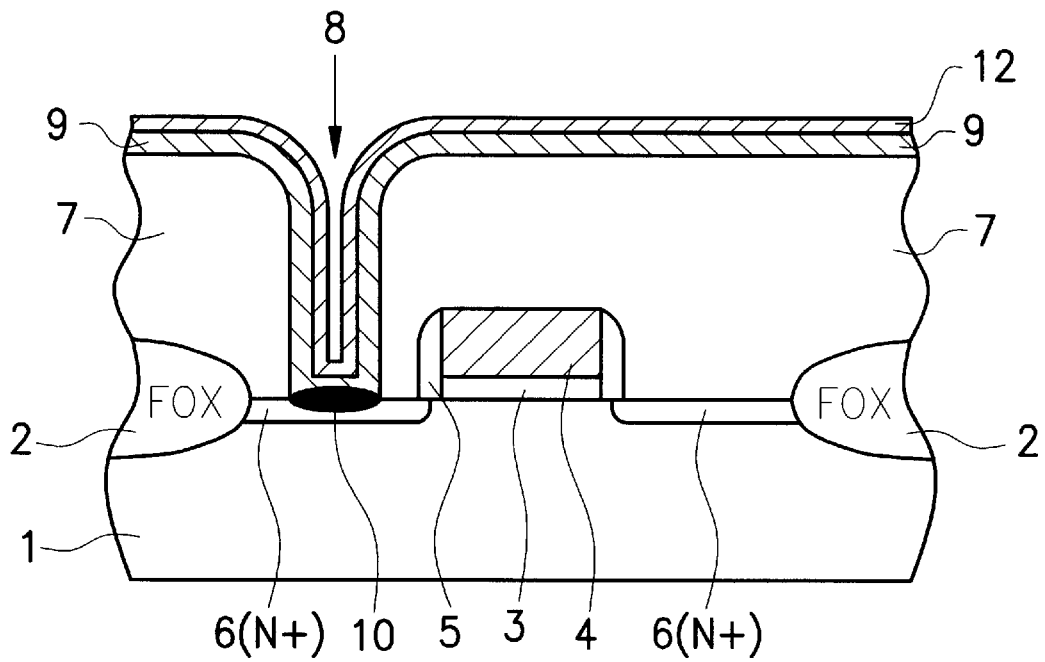
FIGS. 5–6 schematically show, in a cross-sectional representation, another process used to create an enhanced barrier layer.
Figure 6:
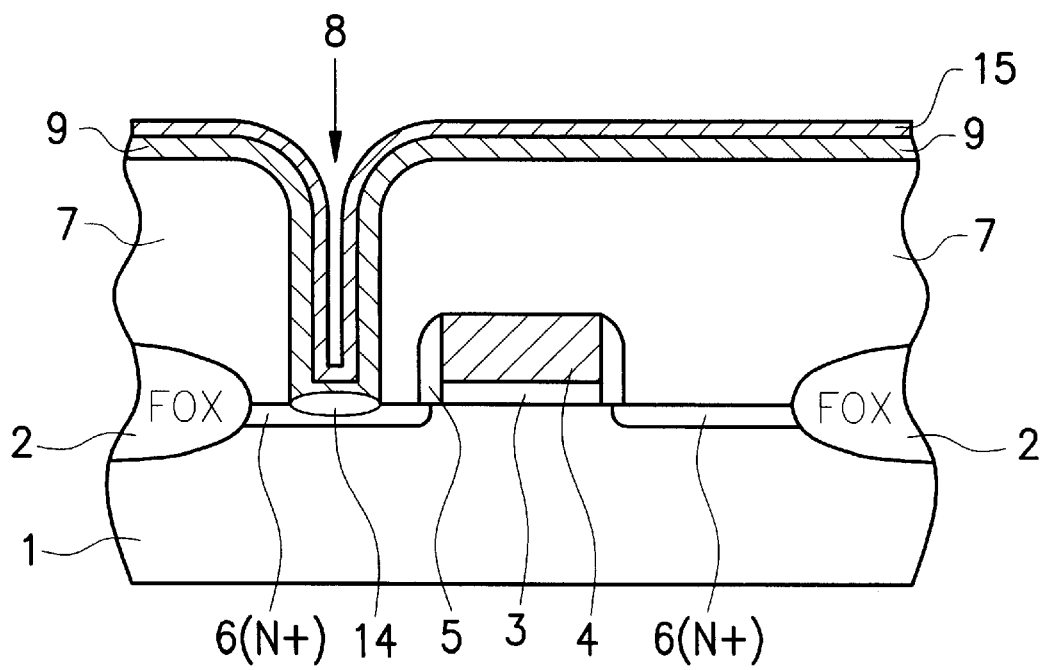

FIGS. 5–6, illustrate another method of forming thick, effective, titanium nitride barriers. Referring back to the structure shown in FIG. 2, a layer of titanium is first deposited and then a layer of titanium nitride 13 is deposited via d.c. reactive sputtering onto underlying titanium layer 9. The conditions used to sputter titanium nitride layer 13 are preferably the same conditions used previously to deposit titanium nitride layer 12, but for this embodiment the sputtering time is increased to deposit a titanium nitride layer 13 between about 500 to 1000 Å thick. Preferably, a dedicated sputtering chamber, used only for reactive sputtering of titanium nitride, is employed. The barrier effectiveness of titanium nitride layer 13 is next enhanced by subjecting the structure, depicted in FIG. 5, to a rapid thermal annealing cycle at a temperature between about 575 to 625° C., for a time between about 45 to 75 seconds. This initial rapid thermal anneal step is followed by additional annealing at a temperature between about 725 to 775° C. for a time between about 15 to 25 seconds, preferably in an ammonia and oxygen ambient. This annealing converts the underlying titanium layer 9 to titanium disilicide layer 14, while converting titanium nitride layer 13 to an oxygen containing titanium nitride layer 15, as shown schematically in FIG. 6. The addition of oxygen enhances the barrier characteristics of the titanium nitride layer 15.

Figure 7:
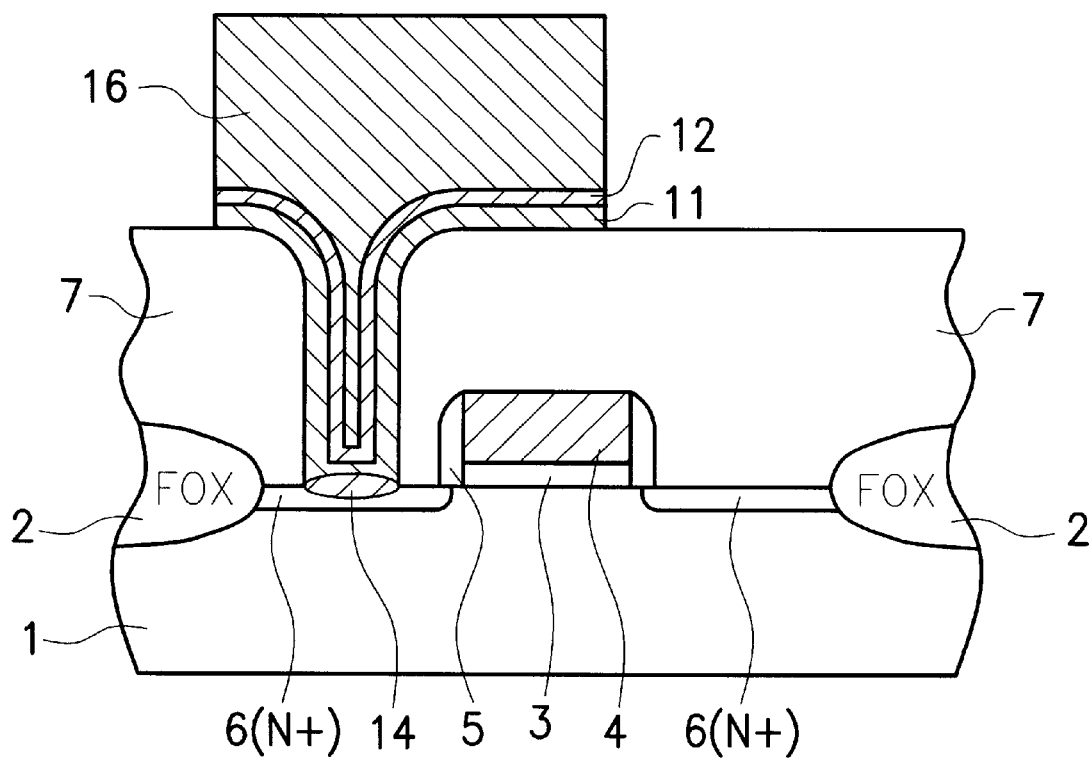
FIG. 7 shows the metallized silicon device structure fabricated using an enhanced barrier layer.

FIG. 7 shows the formation of an NFET device structure incorporating an enhanced barrier layer, for example, using the barrier formed in accordance with the method illustrated in FIGS. 3–4. An interconnect metallization layer, composed of aluminum with between about 0.5 to 1.0% copper and between about 0.5 to 1.0% silicon, is deposited via d.c. sputtering to a thickness of between about 500 to 10000 Å. Conventional photolithographic and RIE procedures using chlorine etch chemistry are used to produce the illustrated metal interconnect structure 16. An RIE overetch removes the unwanted portions of titanium nitride layer 11 and titanium nitride layer 12. Photoresist removal is then performed using oxygen plasma ashing, followed by careful wet chemical cleansing.

Figure 8:
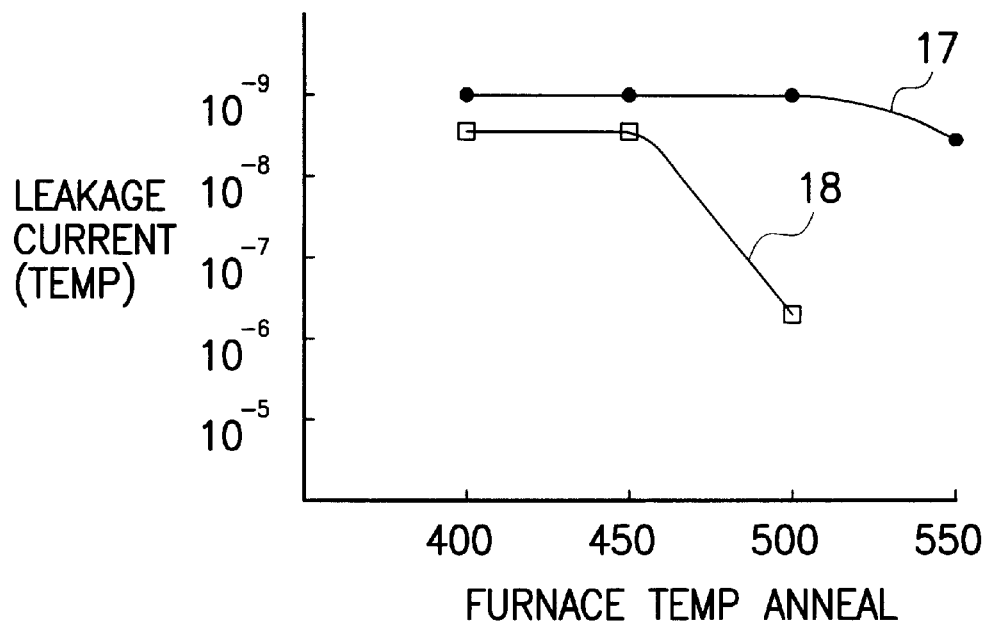
FIG. 8 graphically indicates the improvement in barrier characteristics for structures fabricated using an enhanced barrier layer.
Figure 9:
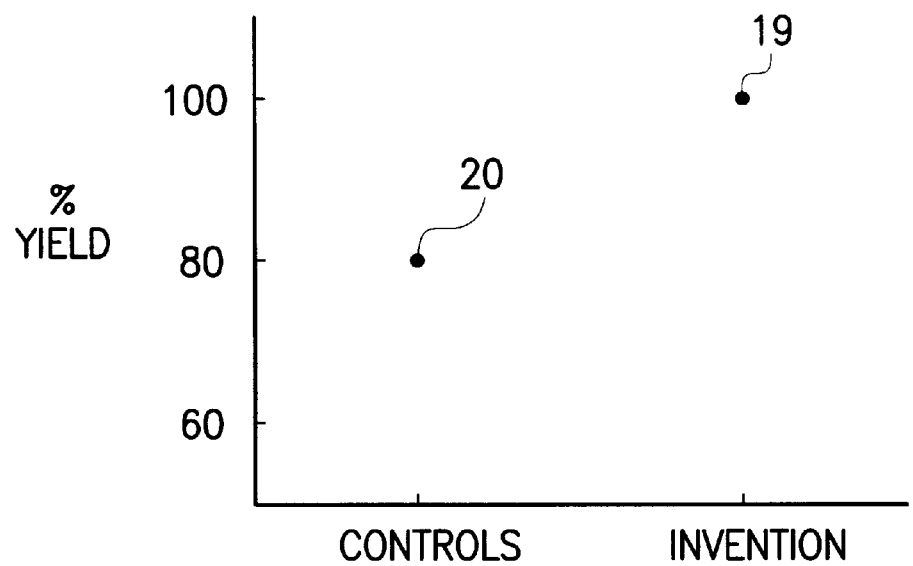
FIG. 9 graphically shows a comparison of yield for devices fabricated with, and without, the enhanced barrier process.

FIGS. 8–9 graphically show the effect of the enhanced barrier on penetration resistance and on the yield. The devices measured were fabricated using the barrier formed using the RTN process, followed by deposition of an additional titanium nitride layer by reactive sputter depositing. FIG. 8 shows the effectiveness of the enhanced barrier, using the two layer titanium nitride concept, for preventing aluminum penetration. Junction leakage, attributed to aluminum penetration, was measured for structures 17 fabricated in accordance with aspects of this invention, and also measured for counterpart structures 18 fabricated in a conventional manner. It can be seen that devices fabricated using standard barriers 18 allowed penetration after one hour at a temperature of 450° C., while devices fabricated in accordance with the present invention 17 were able to successfully withstand a temperature of 500° C. for one hour. The ability to withstand the higher temperature is valuable to more reliably accommodate subsequent metallizations, as well as insulation processes, which are preferably performed at higher temperatures. FIG. 9 shows that devices 19 fabricated using the enhanced barrier methods described in this invention, exhibited higher yields than counterpart devices 20 fabricated using conventional barrier techniques.

The process for fabricating enhanced barrier layers to reduce the aluminum penetration phenomena, although shown as part of a NFET device, can also be applied to P-type (PFET) devices, MOSFET devices, CMOS devices, BiCMOS devices, and bipolar devices. In addition, while the contact formation process has been used to form contacts to source/drain regions in a substrate, the process may also be used in forming contacts between other silicon regions, such as polysilicon wiring lines, and metal conductors. While this invention has been particularly shown and described with reference to the preferred embodiments thereof, it will be understood by those skilled in the art that various changes in form and details may be made without departing from the spirit and scope of this invention.

What is claimed is:

1. A method for forming a barrier layer on a semiconductor substrate, comprising the steps of:

providing, on the semiconductor substrate, a transistor device structure containing a doped silicon region;

depositing an insulator layer on the transistor device structure;

opening a contact hole in the insulator layer to the doped silicon region;

depositing a titanium layer on the insulator layer and on the doped silicon region in the contact hole;

depositing a titanium nitride layer on the titanium layer;

annealing the titanium nitride layer in an oxygen and ammonia ambient to convert the titanium layer to an underlying titanium disilicide layer while converting the titanium nitride layer to an oxygen containing titanium nitride layer;

depositing an interconnect metallization layer on the oxygen containing titanium nitride layer; and patterning the interconnect metalization layer and the oxygen containing titanium nitride layer to form an interconnect metallization structure.

2. The method of claim 1, wherein the doped silicon region is a heavily doped N-type region.

3. The method of claim 1, wherein the insulator layer is silicon oxide deposited using any one of low pressure chemical vapor deposition (LPCVD), plasma enhanced chemical vapor deposition (PECVD), and atmospheric pressure chemical vapor deposition (APCVD) processing, at a temperature between about 400 to 800° C., and to a thickness between about 5000 to 10000 Å.

4. The method of claim 1, wherein the contact hole has a diameter between about 0.4 to 0.6 μm.

5. The method of claim 1, wherein the titanium layer is deposited via d.c. sputtering to a thickness between about 300 to 800 Å.

6. A method for forming a barrier layer on a semiconductor substrate, comprising the steps of:

providing, on the semiconductor substrate, a transistor device structure containing a doped silicon region;

depositing an insulator layer on the transistor device structure;

opening a contact hole in the insulator layer to the doped silicon region;

depositing a titanium layer on the insulator layer and on the doped silicon region via the contact hole;

depositing a titanium nitride layer on the titanium layer;

annealing the titanium nitride layer in an oxygen and ammonia ambient to convert the titanium layer to an underlying titanium disilicide layer while converting the titanium nitride layer to an oxygen containing titanium nitride layer;

depositing an interconnect metallization layer on the oxygen containing titanium nitride layer; and patterning the interconnect metalization layer and the oxygen containing titanium nitride layer to form an interconnect metallization structure, wherein the titanium nitride layer is deposited using d.c. reactive sputtering, using a power between about 5000 to 10000 watts, using a nitrogen or ammonia flow between about 20 to 30 sccm, and grown to a thickness between about 500 to 1000 Å.

7. The method of claim 1, wherein the annealing is performed in an ammonia and oxygen ambient, first at a temperature between about 575 to 625° C. for about 60 seconds, then at a temperature between about 725 to 775° C. for about 20 seconds.

8. A method for forming a barrier layer on a semiconductor substrate, comprising the steps of:

providing, on the semiconductor substrate, a transistor device structure containing a doped silicon region;

depositing an insulator layer on the transistor device structure;

opening a contact hole in the insulator layer to the doped silicon region;

depositing a titanium layer on the insulator layer and on the doped silicon region via the contact hole;

depositing a titanium nitride layer on the titanium layer;

annealing the titanium nitride layer in an oxygen and ammonia ambient to convert the titanium layer to an underlying titanium disilicide layer while converting the titanium nitride layer to an oxygen containing titanium nitride layer;

depositing an interconnect metallization layer on the oxygen containing titanium nitride layer; and patterning the interconnect metalization layer and the oxygen containing titanium nitride layer to form an interconnect metallization structure, wherein the titanium disilicide layer, formed on the specific doped silicon region as a result of the rapid thermal annealing, is between about 200 to 500 Å.

9. A method for forming a barrier layer on a semiconductor substrate, comprising the steps of:

providing, on the semiconductor substrate, a transistor device structure containing a doped silicon region;

depositing an insulator layer on the transistor device structure;

opening a contact hole in the insulator layer to the doped silicon region;

depositing a titanium layer on the insulator layer and on the doped silicon region via the contact hole;

depositing a titanium nitride layer on the titanium layer;

annealing the titanium nitride layer in an oxygen and ammonia ambient to convert the titanium layer to an underlying titanium disilicide layer while converting the titanium nitride layer to an oxygen containing titanium nitride layer;

depositing an interconnect metallization layer on the oxygen containing titanium nitride layer; and patterning the interconnect metalization layer and the oxygen containing titanium nitride layer to form an interconnect metallization structure, wherein the interconnect metallization layer is aluminum containing between about 0.5 to 1.0% copper and between about 0.5 to 1.0% silicon, deposited using d.c. sputtering to a thickness between about 5000 to 10000 Å.

* * * * *